(12) United States Patent
Kozel et al.

(10) Patent No.: US 7,386,772 B1
(45) Date of Patent: Jun. 10, 2008

(54) TEST MODULE FOR TESTING OF ELECTRONIC SYSTEMS

(75) Inventors: Michael J. Kozel, Upton, MA (US); Jeffrey A. Moore, South Grafton, MA (US); Brandon C. Barney, Hudson, MA (US)

(73) Assignee: EMC Corporation, Hopkinton, MA (US)

( * ) Notice: Subject to any disclaimer, the term of this patent is extended or adjusted under 35 U.S.C. 154(b) by 485 days.

(21) Appl. No.: 11/017,307

(22) Filed: Dec. 20, 2004

(51) Int. Cl.
*G01R 31/28* (2006.01)
(52) U.S. Cl. .................................................. 714/724
(58) Field of Classification Search ................ 714/724
See application file for complete search history.

(56) References Cited

U.S. PATENT DOCUMENTS

| 5,590,354 A | * | 12/1996 | Klapproth et al. ............ 714/30 |
| 5,627,842 A | | 5/1997 | Brown et al. ................ 714/727 |
| 5,852,617 A | * | 12/1998 | Mote, Jr. .................... 714/726 |
| 5,928,374 A | * | 7/1999 | Shimizu et al. ............. 714/724 |
| 6,539,510 B1 | * | 3/2003 | St. Pierre et al. ........... 714/727 |
| 6,933,747 B1 | | 8/2005 | Bauer et al. .................. 326/38 |

* cited by examiner

*Primary Examiner*—Jacques Louis-Jacques
*Assistant Examiner*—John J. Tabone, Jr.
(74) *Attorney, Agent, or Firm*—BainwoodHuang

(57) ABSTRACT

A test module is provided for testing system modules. All the test circuitry and test connectors reside on the test module. The test module is coupled to the system modules during testing, and is removed from the system after testing. Test connectors and test circuitry on the test module support such test functions as voltage margining, CPU emulation, and JTAG boundary scanning. A JTAG selection function can also be provided for selecting one or more JTAG loops for testing individually or as a single loop. The test module further includes level shifters for converting between 3.3V and 1.2V.

21 Claims, 7 Drawing Sheets

REAR VIEW

FRONT VIEW

TEST MODULE FOR TESTING OF ELECTRONIC SYSTEMS

FIELD OF THE INVENTION

The present invention relates generally to the field of testing of electronic systems, and particularly to removable test modules for use in testing of system modules in electronic systems.

BACKGROUND OF THE INVENTION

Today's networked computing environments are used in businesses for generating and storing all types of critical data. The systems used for moving, storing, and manipulating this critical data are expected to have high performance, high capacity, and high reliability, all in an ever smaller package. Many of these systems are further required to be as low cost as possible.

Many things add to the cost of the system. One of these is manufacturing testing. As systems have become more complicated, manufacturing test protocols and systems have followed in step. For example, components on boards often have pins dedicated to JTAG, a boundary scan protocol for testing the continuity of device pins and board signals. CPU emulation is also frequently used in manufacturing test. Other manufacturing tests include voltage margining. In all cases, the test circuitry and test connectors needed to support the test equipment must be mounted on the modules to be tested, and thus become integrated into the product as shipped. Though manufacturing test is necessary, the added cost of the test circuitry and test connectors adds unnecessary cost to the modules and thus to the product. What is needed is a way to separate manufacturing test circuitry and connectors from the modules under test so that the test circuitry and connectors need not ship with the finished product.

SUMMARY OF THE INVENTION

In accordance with the principles of the invention, a test module is provided for testing system modules. All the test circuitry and connectors reside on the test module. The test module is coupled to the system modules during testing, and is removed from the system after testing.

Accordingly, the test module of the invention includes module connectors for coupling to one or more system modules. At least one system module is testable by test circuitry and one or more test devices. The test module includes the test connectors for coupling to the one or more test devices, and includes the test circuitry. During testing of the system modules, test signals flow from the test devices through the test connectors, through the test circuitry, and through the module connectors to the system modules. Upon completion of testing, the test module is decoupled from the system modules and removed from the system.

The test connectors on the test module may include manufacturing test connectors for voltage margining, ITP connectors for CPU emulation, and/or JTAG connectors for JTAG boundary scanning. A JTAG selection connector can also be provided for selecting one or more of a plurality of JTAG loops on the one or more system modules for testing.

According to another aspect of the invention, circuitry is provided to interface between test technology and newer, lower voltage components located on the system modules. A level shifter consists of an analog switch having a first input, a second input, an output, and a select line. The first input is coupled to a first voltage level, the second input is coupled to ground, and the select input is coupled to a signal that switches between ground and a second voltage level. The output signal switches between ground and the first voltage level in the same manner as the select input switches between ground and the second voltage level. The second voltage level is thus converted to the first voltage level. The level shifter is particularly convenient for shifting between 1.2 Volts and 3.3 Volts.

According to a further aspect of the invention, a flexible JTAG implementation is provided. A plurality of JTAG loops is implemented on one or more system modules. Each loop can be tested separately, or any combination of the loops can be coupled together and tested as a single loop. Loop testing is controlled by a switch, wherein the loop is tested if the switch is in a first state and the loop is bypassed when the switch is in a second state. If two or more of the switches are in the first state, the corresponding loops are coupled together for testing as one loop. The switch is preferably located on the test module separate from the system modules. The switch may be a manual switch, or it may be an automatic, software controlled switch.

The test module of the invention removes all the test circuitry and test connectors from the system modules, thus lowering the total cost of the shipping system.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF EXEMPLARY EMBODIMENTS

In accordance with the principles of the invention, a test module is provided for testing system modules in a system. Test circuitry and test connectors reside on the test module. The test module is coupled to the system modules during testing, and is removed from the system after testing. The test circuitry and test connectors thus need not ship with the finished product.

Figure 1:
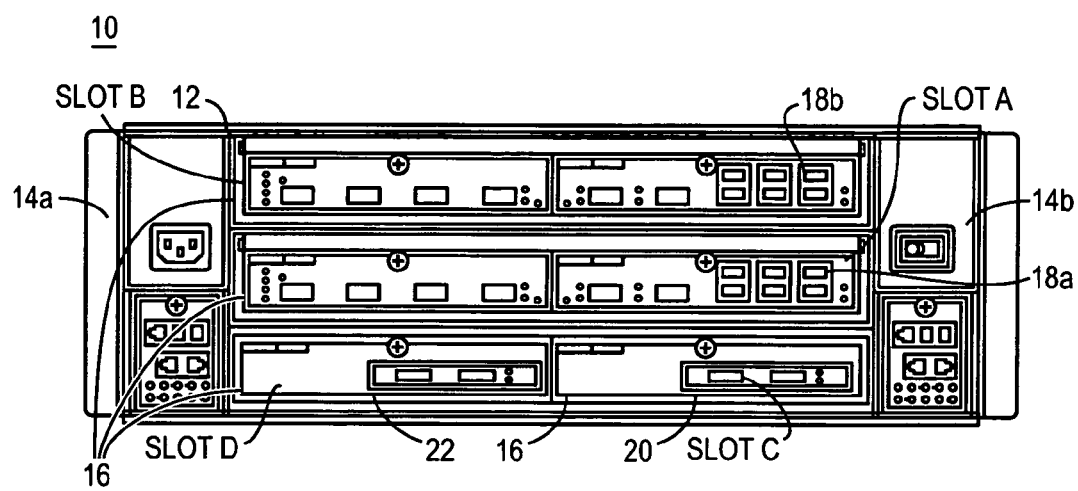
FIG. 1 is a rear view of a system in which the invention is implemented, showing system modules to be tested.

Referring to FIG. 1, there is shown a rear view of a system 10 that is one example of a system in which the principles of the invention may be employed. The system shown is for use in a storage system; however, this is by example only.

The invention is equally employable in computing systems, networking systems, etc. A chassis 12 includes on its sides dual redundant power supplies 14a and 14b. System modules 16 reside between the power supplies 14a,b. The system modules 16 are of various types. Redundant control modules, or blades, 18a and 18b are installed in Slots A and B. I/O Annex boards 20 and 22 are installed in slots C and D below the blades 18a,b, and provide various different types of additional I/O capability for the blades 18a,b. The system modules 16 are all coupled to a midplane 24 (FIG. 4).

Figure 2:
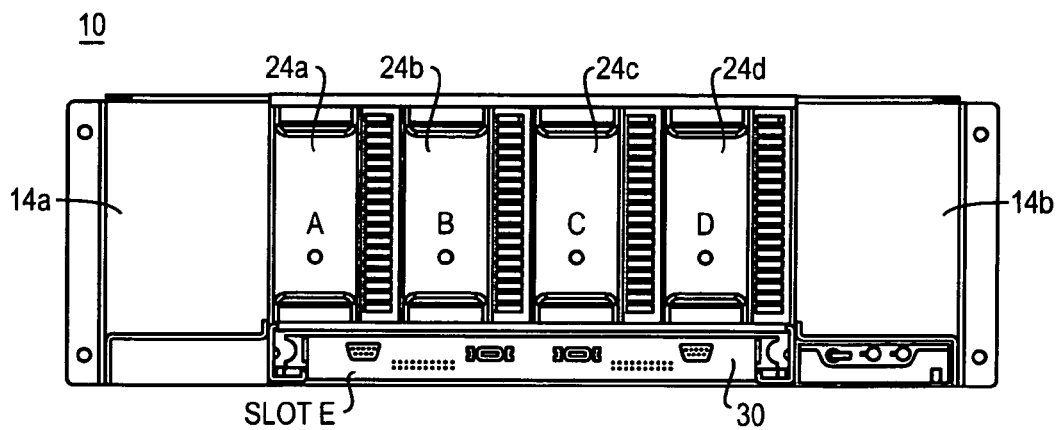
FIG. 2 is a front view of the system of FIG. 1, showing the test module of the invention.

Referring to FIG. 2, there is shown a front view of the same system 10 as configured for test purposes. Between the power supplies 14a and 14 are blowers 24a-24d, used for cooling the blades 18a and 18b in the system. Below the blowers in a slot E is a test module 30 in accordance with the invention. The test module 30 is coupled to the midplane 24, on the side opposite the side to which the blades 18a,b, and I/O annex boards 20 and 22 are coupled. The test module 30 is installed in the system 10 only when one or more of the blades 18a, 18b, and I/O Annex boards 20, 22 are under test. After testing, when the system 10 is actually shipped, the test module 30 is not installed in the system 10 and the slot E is covered with a bezel.

Figure 3:
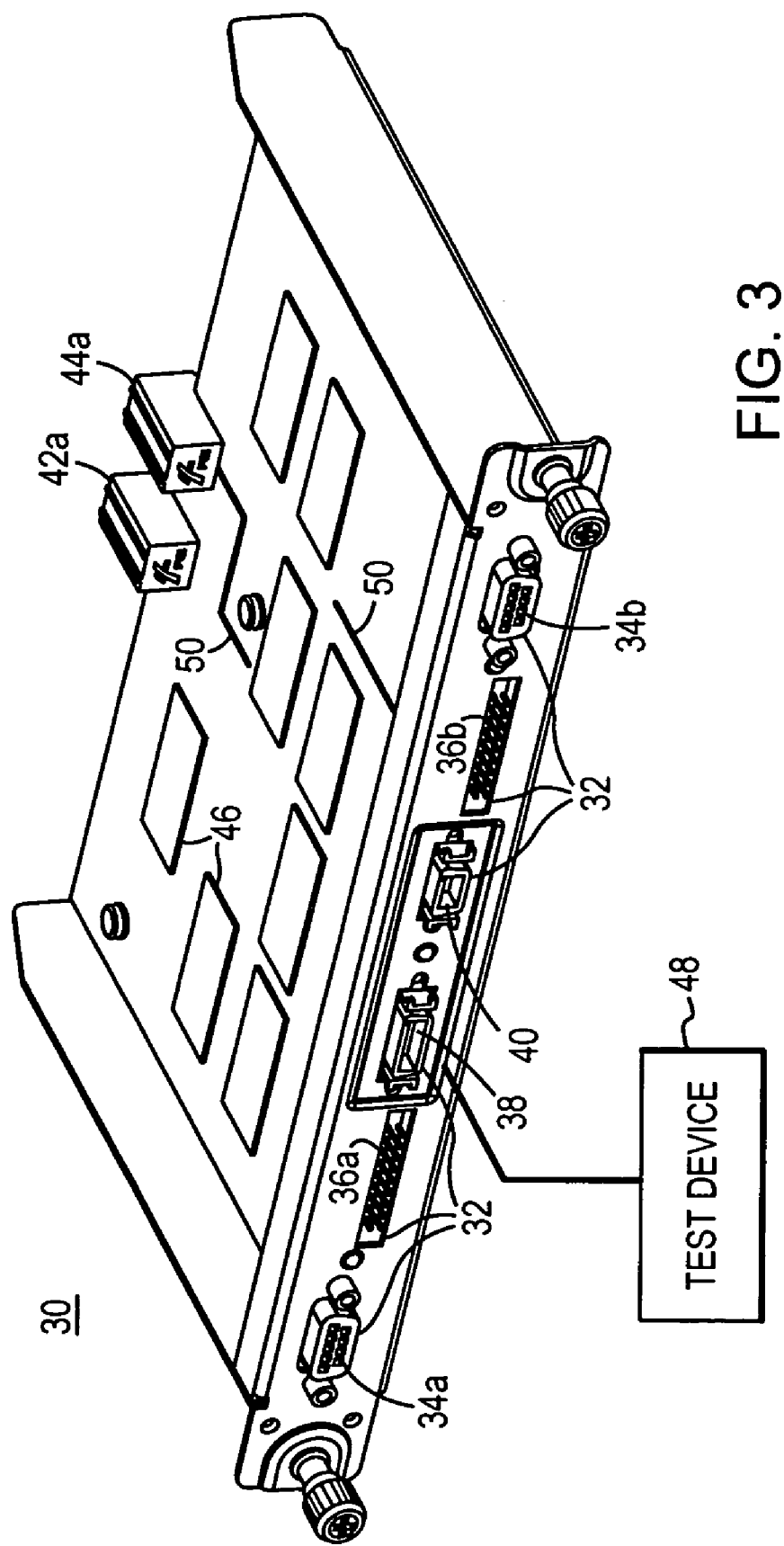
FIG. 3 is an isometric view of the test module of the invention.

Referring to FIG. 3, the test module 30 is shown in more detail. Mounted on the front of the test module 30 are test connectors 32. Test connectors 32 include manufacturing connectors 34a and 34b, in-circuit test probe (ITP) connectors 36a and 36b, and a JTAG connector 38 and JTAG selection connector 40. On the rear of the module are two module connectors 42a and 44a for coupling the test module 30 to the system modules 16 via the midplane 24. Each blade 18a,b and I/O Annex board 20 and 22 includes corresponding module connectors 42b and 44b for coupling to the connectors 42a and 44a via the midplane 24 (FIG. 4). The module connectors 42a,b and 44a,b are preferably implemented as FCI connectors. Test circuitry 46 resides on the test module 30. The test circuitry 46 is used by external test equipment to perform testing on the system modules 16. When a given external test device 48, such as a CPU emulator or a JTAG boundary scanner is plugged into a test connector 32 on the test module 30, test signals 50 flow from the test device 48 through the test connector 32, through the test circuitry 46, and through the module connectors 42a or 44a to the system module(s) 16 under test. Return signals flow back along the reverse path.

Figure 4:
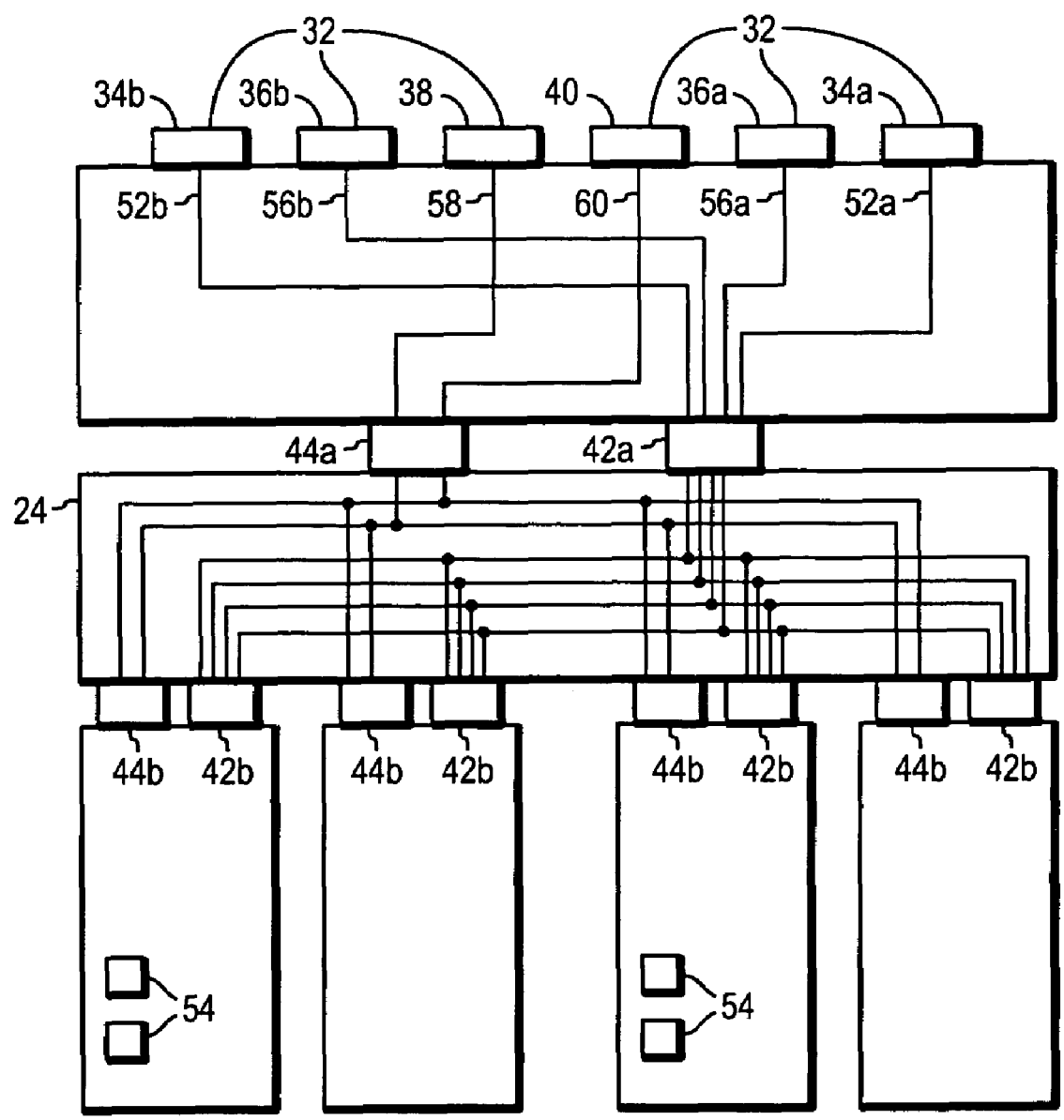
FIG. 4 is a schematic representation of the interconnections between one of the system modules and the test connectors on the test module.

Referring to FIG. 4, the interconnections between the test connectors 32 and the system modules 16 are shown. The manufacturing connectors 34a and 34b are used to perform voltage margining of the voltage rails on the blades 18a, 18b and I/O annex boards 20 and 22 during manufacturing test. The manufacturing connectors 34a,b are preferably implemented as db9 connectors. Voltage margin signals 52a,b are sent from the manufacturing connectors 34a,b to each blade 18a,b and I/O annex board 20 and 22 via the module connectors 42a and 42b. Voltage margining is then performed in a known manner.

The ITP connectors 36a and 36b are used during system debug and manufacturing test by in-circuit testers such as CPU emulators. The ITP connectors are preferably implemented as ITP 700 connectors, which are 26 pin dual row connectors, preferably with a pin missing as a key pin. Each blade 18a and 18b includes several CPUs 54. CPU emulators such as the American Arium or the ITT Micro-master can be plugged into the ITP connectors 36a,b. Emulation signals 56a,b are passed through the module connectors 42a and 42b to the blades 18a and 18b, where the emulation signals 56a,b are then used in a known manner. If I/O annex boards 20 and 22 also have CPUs mounted thereon, then the emulation signals 56a,b are also coupled to the boards 20 and 22.

The JTAG connectors 38 and 40 are used during system debug and manufacturing test for JTAG boundary scan, as defined in IEEE Std. 1149.1 and 1149.6. (IEEE Std. 1149.4 analog JTAG testing is not performed in the preferred embodiment; however, the invention can certainly be applied to analog JTAG testing.) JTAG boundary scan signals 58 and select signals 60 are passed to and from the system modules 16 a,b via the module connectors 44a and 44b.

Figure 5:
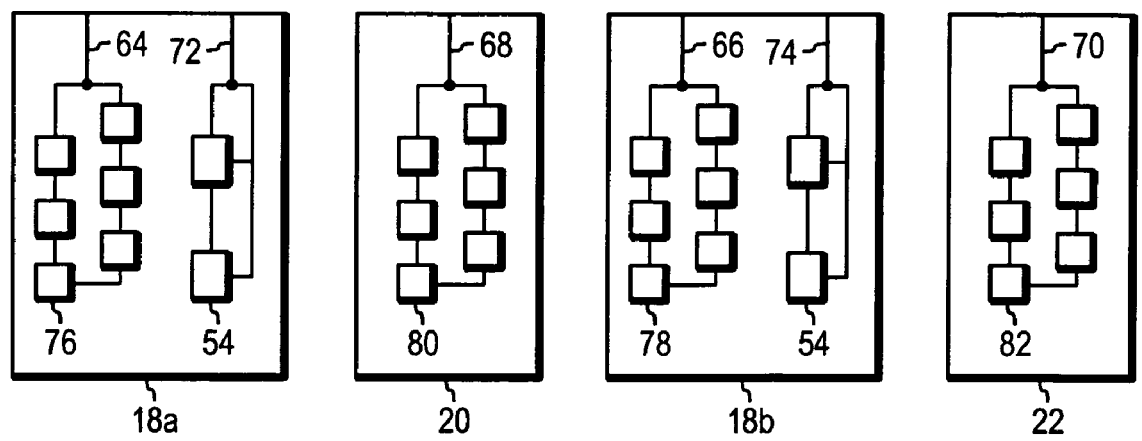
FIG. 5 is a schematic representation of JTAG loops on the system modules.

In accordance with an aspect of the invention, several different JTAG loops are available for testing. Referring to FIG. 5, six JTAG loops 64, 66, 68, 70, 72, and 74 are shown. A first loop 64 is shown coupled to the blade 18a and through the components 76 thereon. A second loop 66 is shown coupled to the blade 18b and through the components 78 thereon. A third loop 68 is shown coupled to the I/O Annex board 20 and through the components 80 thereon. A fourth loop 70 is shown coupled to the I/O Annex board 22 and through the components 82 thereon. A fifth loop 72 is shown coupled to the blade 18a and through the CPU components 54 thereon. A sixth loop 74 is shown coupled to the blade 18b and through the CPU components 54 thereon.

In accordance with a further aspect of the invention, each loop is accessible for testing separately, or, any of the loops can be coupled together and tested as a single loop. Furthermore, loop selection may be performed manually or automatically. When performed automatically, configuration software running on a PC or similar device controls signals to the JTAG selection connector 40. Loop selection can also be performed manually by hand-setting of switches on the test module 30.

The JTAG signals for the loops 64, 66, 68, and 70 are provided via the JTAG connector 38. The JTAG signals for the CPU loops 72 and 74 are provided via the ITP connectors 36a and 36b. This is because the ITP protocol includes as a subset the JTAG signals. The test board 30 therefore efficiently uses these signals for both JTAG testing and for CPU testing. It is ensured that, when a tester such as ITT Micro-Master is plugged into an ITP connector 36a or 36b, the JTAG boundary scan functions are disabled, whether a JTAG test device is plugged in to the JTAG connector 38 or not.

Figure 6A:
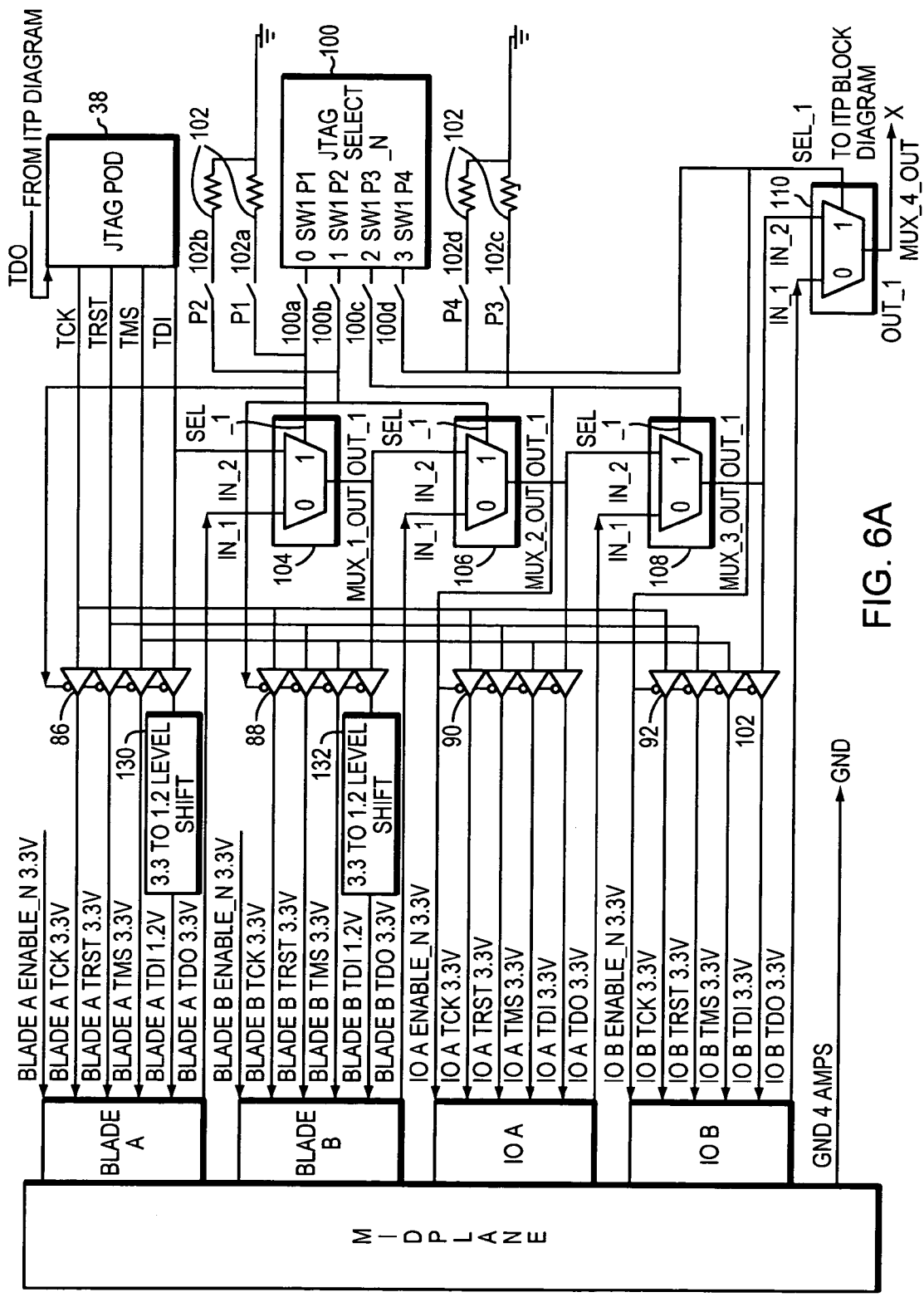
FIGS. 6A and 6B are schematic representations of the JTAG circuitry and JTAG select switches on the test module in accordance with the invention.
Figure 6B:
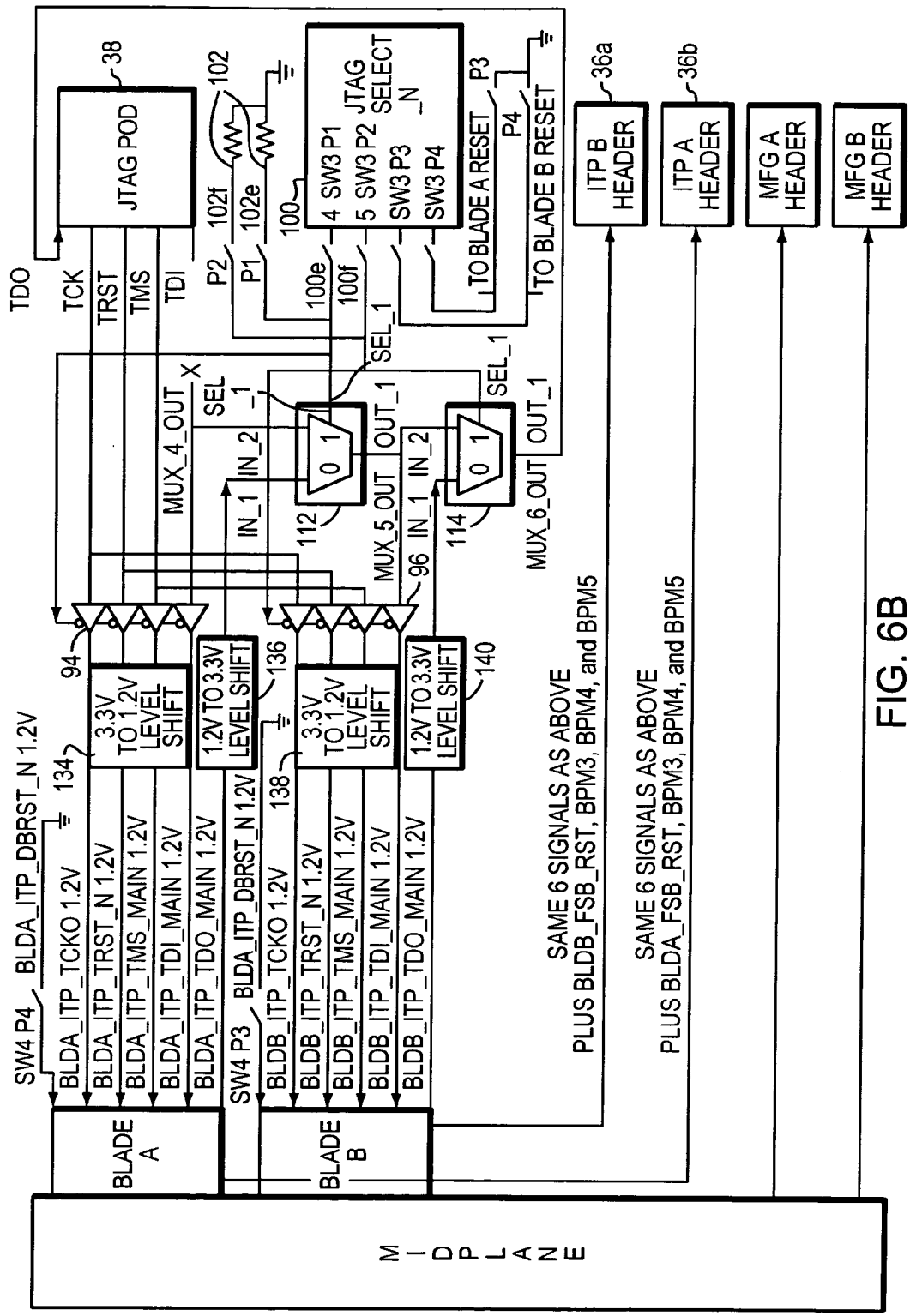

Referring to FIGS. 6A and 6B, the test circuitry 46 used for JTAG testing is shown. In FIG. 6A, there is shown a schematic representation of the JTAG logic and interconnections for loops 64, 66, 68, and 70. In FIG. 6B, there is shown a representation of the JTAG logic and interconnections for loops 72 and 74, and for the ITP interconnections.

In FIG. 6A, the JTAG connector 38 drives the standard JTAG loop signals TCK, TRST, TMS, and TDI, and accepts the JTAG signal TDO. The TCK, TRST, TMS, and TDI signals are coupled via sets of enable devices 86, 88, 90, and 92 to the Blade 18a loop 64, the blade 18b loop 66, the I/O annex board 20 loop 68, and the I/O annex board 22 loop 70 respectively. In FIG. 6B, The TCK, TRST, TMS, and TDI signals are coupled via sets of enable devices 94 and 96 to the Blade 18a CPU loop 72 and the blade 18b CPU loop 74.

The Blade 18a loop 64 receives signals Blade A TCK 3.3V, Blade A TRST 3.3V, Blade A TMS 3.3V, and Blade A TDI 1.2V from enable devices 86, and returns Blade A TDO 3.3V. The blade 18b loop 66 receives signals Blade B TCK 3.3V, Blade B TRST 3.3V, Blade B TMS 3.3V, and Blade B TDI 1.2V from enable devices 88, and returns Blade A TDO 3.3V. The I/O annex 20 loop 68 receives signals IO A TCK 3.3V, IO A TRST 3.3V, IO A TMS 3.3V, IO A TDI 3.3V from enable devices 90, and returns IO A TDO 3.3V. The I/O annex 22 loop 70 receives signals IO B TCK 3.3V, IO B TRST 3.3V, IO B TMS 3.3V, IO B TDI 3.3V from enable devices 92, and returns IO B TDO 3.3V. In FIG. 6B the blade 18*a* CPU loop 72 receives signals BLDA_ITP_TCK 0 1.2V, BLDA_ITP_TRST_N 1.2V, BLDA_ITP_TMS_MAIN 1.2V, and BLDA_ITP_TDI_MAIN 1.2V from enable devices 94, and returns BLDA_ITP_TDO_MAIN 1.2V. The blade 18*b* CPU loop 74 receives signals BLDB_ITP_TCK 0 1.2V, BLDB_ITP_TRST_N 1.2V, BLDB_ITP_TMS_MAIN 1.2V, and BLDB_ITP_TDI_MAIN 1.2V from enable devices 96, and returns BLDB_ITP_TDO_MAIN 1.2V. In FIG. 6B it can also be seen that the blade 18*a* ITP signals BLDA_FSB_RST, BPM3, BPM4, and BPM5 are returned to the ITP connector 36*a*, and the blade 18*b* ITP signals BLDB_FSB_RST, BPM3, BPM4, and BPM5 are returned to the ITP connector 36*b*. These signals are used for ITP testing only and not for JTAG testing.

The JTAG select connector 40 drives switch 100 having switches 100*a*-100*f* when an automatic selection device such as a PC running configuration software is plugged into the JTAG select connector 40. The switches 100*a*-100*f* select the loops to be tested. Though a physical switch herein depicts the switch 100 for clarity of function, it should be understood that the switch function may occur on the PC or in the software, the resultant switched signals then being driven to the selection connector 40. A manual switch 102, including switches 102*a*-102*f* can alternately be used to select the loops to be tested. When using a PC to automatically select the loops to be tested, switches 100*a*-100*f* must be closed and 102*a*-102*f* must be opened. When using the manual switch 102 to select the loops to be tested, the switches 100*a*-100*f* must be opened and the switches 102*a*-102*f* selectively closed depending on the combination of loops to be tested, as will be further described. The switches 100 and 102 are coupled to multiplexers 104, 106, 108, 110, 112, and 114. The switches configure the multiplexers to choose the JTAG loops to be tested. Each multiplexer has two inputs in_1 and in_2, a select line sel_1, and an output out_1. The select line sel_1 drives one or the other of the inputs in_1 and in_2 to the output out_1, depending on the state of the select line.

The multiplexer 104 accepts at inputs in_1 and in_2 the signals TDI and Blade A TDO 3.3V, and provides at output out_1 the signal mux_1_out. The multiplexer 106 accepts at inputs in_1 and in_2 the signals Blade B TDO 3.3V and mux_1_out, and provides at output out_1 the signal mux_2_out. The multiplexer 108 accepts as inputs in_1 and in_2 the signals IO A TDO 3.3V and mux_2_out, and provides at output out_1 the signal mux_3_out. The multiplexer 110 accepts at inputs in_1 and in_2 the signals IO B TDO 3.3V and mux_3_out, and provides at output out_1 the signal mux_4_out. The output of the multiplexer 110 is coupled to the multiplexer 112. The multiplexer 112 accepts as inputs in_1 and in_2 the signals BLDA_ITP_TDO_MAIN_1.2V and mux_4_out and produces the signal mux_5_out. The multiplexer 114 accepts as inputs in_1 and in_2 the signals BLDB_ITP_TDO_MAIN_1.2V and mux_4_out and produces the signal mux_5_out. The signal mux_5_out is fed back to the JTAG connector 38 as the signal TDO.

When configured automatically via configuration software that drives the JTAG selection connector 40, the multiplexer 104 select line sel_1 is driven by the switch 100*a*. The multiplexer 106 select line sel_1 is driven by the switch 100*b*. The multiplexer 108 select line sel_1 is driven by the switch 100*c*. The multiplexer 110 select line sel_1 is driven by the switch 100*d*. The multiplexer 112 select line sel_1 is driven by the switch 100*e*. The multiplexer 114 select line sel_1 is driven by the switch 100*f*.

When configured manually via the switch 102, the multiplexer 104 select line sel_1 is driven by the switch 102*a*. The multiplexer 106 select line sel_1 is driven by the switch 102*b*. The multiplexer 108 select line sel_1 is driven by the switch 102*c*. The multiplexer 110 select line sel_1 is driven by the switch 102*d*. The multiplexer 112 select line sel1 is driven by the switch 102*e*. The multiplexer 114 select line sel1 is driven by the switch 102*f*. The following assumes that one or the other of the automatic switch 100 and manual switch 102 are in use. The following also assumes that no ITP tester is in use, for when an ITP tester is in use, none of the enable devices 86, 88, 90, 92, 94, and 96 can be enabled for JTAG use.

Each switch 100*a-f* and 102*a-f* can be placed in a first state, closed, or a second state, open. When closed, the switch activates the signal to which it is coupled. When open, it does not.

If the switch 100*a* is switched to closed automatically, or if the switch 102*a* is switched to closed manually, the enable devices 86 are turned on and the JTAG signals are driven to the blade 18*a* loop 64. The multiplexer 104 input Blade A TDO 3.3V is selected to be driven to the output mux_1_out. In this case the blade 18*a* loop 64 is tested. If on the other hand the switch 100 is open automatically, or if the switch 102 is opened manually, the enable devices 86 are turned off and the JTAG signals are not driven to the blade 18*a* loop 64. The multiplexer 104 input TDI is selected to be driven to the output mux_1_out. In this case the blade 18*a* loop 64 is not tested.

If the switch 100*b* is closed automatically, or if the switch 102*b* is closed manually, the enable devices 88 are turned on and the JTAG signals are driven to the blade 18*b* loop 66. The blade 18*b* loop input BLADE B TDI 1.2V is driven by the mux_1_out signal, and thus is either the JTAG TDI signal or the output of the blade 18*b* JTAG loop 64. The multiplexer 106 input Blade B TDO 3.3V is selected to be driven to the output mux_2_out. In this case the blade 18*b* loop 66 is tested. If on the other hand the switch 100*b* is opened automatically, or if the switch 102*b* is opened manually, the enable devices 88 are turned off and the JTAG signals are not driven to the blade 18*b* loop 66. The multiplexer 106 input mux_1_out is selected to be driven to the output mux_2_out. In this case the blade 18*b* loop 66 is not tested. Note that the combination of switch inputs 100*a* and 100*b* (automatic) or 102*a* and 102*b* (manual) can cause the blade 18*a* loop 64, or the blade 18*b* loop 66, or both to be tested.

If the switch 100*c* is closed automatically, or if the switch 102*c* is closed manually, the enable devices 90 are turned on and the JTAG signals are driven to the I/O annex board 20. The multiplexer 108 input IO A TDO 3.3V is selected to be driven to the output mux_3_out. In this case the I/O annex board 20 JTAG loop 68 is tested. If on the other hand the switch 100*c* is opened automatically, or if the switch 102*c* is opened manually, the enable devices 90 are turned off and the JTAG signals are not driven to the I/O annex board 20 loop 68. The multiplexer 108 input mux_2_out is selected to be driven to the output mux_3_out. In this case I/O annex board 20 loop 68 is not tested. The output mux_3_out represents any combination of loop 64, loop 66, and loop 68, depending on the settings of the switches.

If the switch 100*d* is closed automatically, or if the switch 102*d* is enabled manually, the enable devices 92 are turned on and the JTAG signals are driven to the I/O annex board 22 loop 70. The multiplexer 110 input IO B TDO 3.3V is selected to be driven to the output mux_4_out. In this case the I/O annex board 22 loop 70 is tested. If on the other hand the switch 100*d* is opened automatically, or if the switch 102*d* is opened manually, the enable devices 92 are turned off and the JTAG signals are not driven to the I/O annex board 22 loop 70. The multiplexer 110 input mux_3_out is selected to be driven to the output mux_4_out. In this case I/O annex board 22 loop 70 is not tested. The output mux_4_out represents any combination of loop 64, loop 66, loop 68, and loop 70 depending on the settings of the switches.

If the switch 100*e* is closed automatically, or if the switch 102*e* is closed manually, the enable devices 94 are turned on and the JTAG signals are driven to the blade A CPU loop 72. The multiplexer 112 input BLDA_ITP_TDO_MAIN 1.2V is selected to be driven to the output mux_5_out. In this case the blade 18*a* CPU loop 72 is tested. If on the other hand the switch 100*e* is opened automatically, or if the switch 102*e* is opened manually, the enable devices 94 are turned off and the JTAG signals are not driven to the blade A CPU loop 72. The multiplexer 112 input mux_4_out is selected to be driven to the output mux_5_out. In this case the blade 18*a* CPU loop 72 is not tested. The output mux_5_out represents any combination of loop 64, loop 66, loop 68, loop 70 and loop 72 depending on the settings of the switches.

If the switch 100*f* is closed automatically, or if the switch 102*f* is enabled manually, the enable devices 96 are turned on and the JTAG signals are driven to the blade 18*b* CPU loop 74. The multiplexer 114 input BLDB_ITP_TDO_MAIN 1.2V is selected to be driven to the output mux_5_out. In this case the blade 18*b* CPU loop 74 is tested. If on the other hand the switch 100*f* is opened automatically, or if the switch 102*f* is opened manually, the enable devices 96 are turned off and the JTAG signals are not driven to the blade 18*b* CPU loop 74. The multiplexer 114 input mux_5_out is selected to be driven to the output mux_6_out. In this case the blade 18*b* CPU loop 74 is not tested. The output mux_6_out represents any combination of loop 64, loop 66, loop 68, loop 70, loop 72 and loop 74 depending on the settings of the switches.

It is now clear that any combination of JTAG loops can be tested through use of the switches. For example, to automatically test the blade 18*a* loop 64, the blade 18*b* CPU loop 74, and the I/O annex board 22 loop 70, switches 100*a*, 100*c*, and 100*f* should be closed. Then, TDI is driven from the JTAG connector 38 and through the blade 18*a* loop 64, resulting in BLADE A TDO 3.3V being driven to the multiplexer 104. This signal is selected to the output mux_1_out. The multiplexer 106 is disabled so the blade 18*b* loop 66 is bypassed and the mux_1_out signal is driven to the mux_2_out signal. The multiplexer 108 is also disabled so testing to the I/O annex board 20 loop 68 is also bypassed and the output of the multiplexer 108, mux_3_out, is also BLADE A TDO 3.3V. The multiplexer 110 is enabled, so the I/O annex board 22 loop 70 is tested. In this configuration the blade 18*a* loop 64 is connected to the I/O annex board loop 70. BLADE A TDO 3.3V is driven on the IO B TDI 3.3V line, and the IO B TDO 3.3V signal is driven through the multiplexer 108 to the mux_4 out output. The multiplexer 112 is disabled, so the testing of the blade 18*a* CPU loop 72 is disabled, and the IO B TDO 3.3V signal is passed on to the multiplexer 112. The multiplexer 114 is enabled, so IO B TDO 3.3V is passed to the BLDB_ITP_TDI_MAIN 1.2V input, adding the blade 18*b* CPU loop 74 to the loop under test. The BLDB_ITP_TDO_MAIN 1.2V output is sent though multiplexer 114 to output TDO, back to the JTAG connector 38. Thus any combination of the six separate loops can be tested in accordance with the invention, either via the automatic switch or via the manual switch. This aspect of the invention is highly advantageous in that it allows JTAG testing of individual system modules or modules in combination—a function not heretofore feasible.

Figure 7:
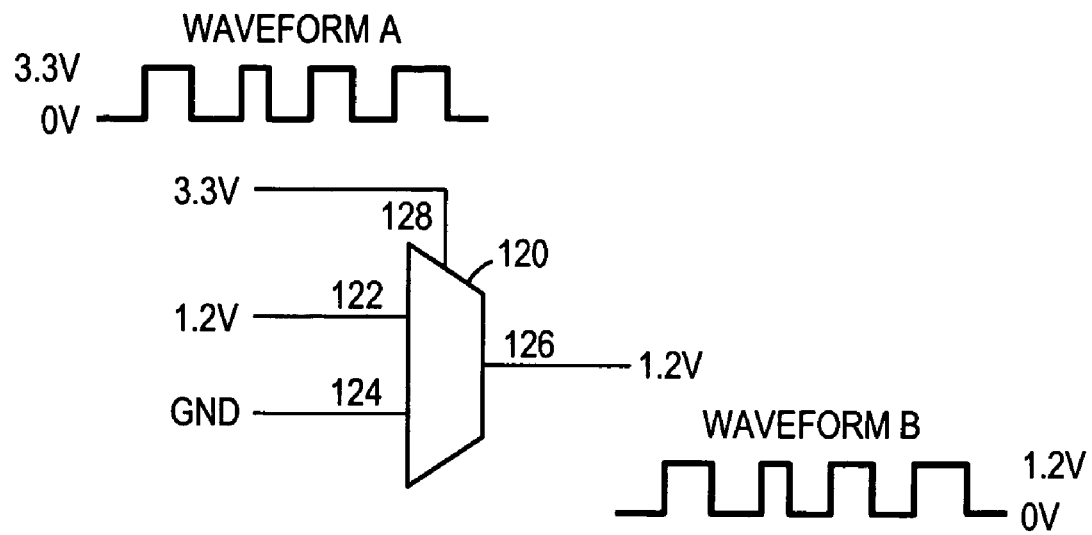
FIG. 7 is a schematic representation of an analog level shifter in accordance with the invention.
Figure 8:
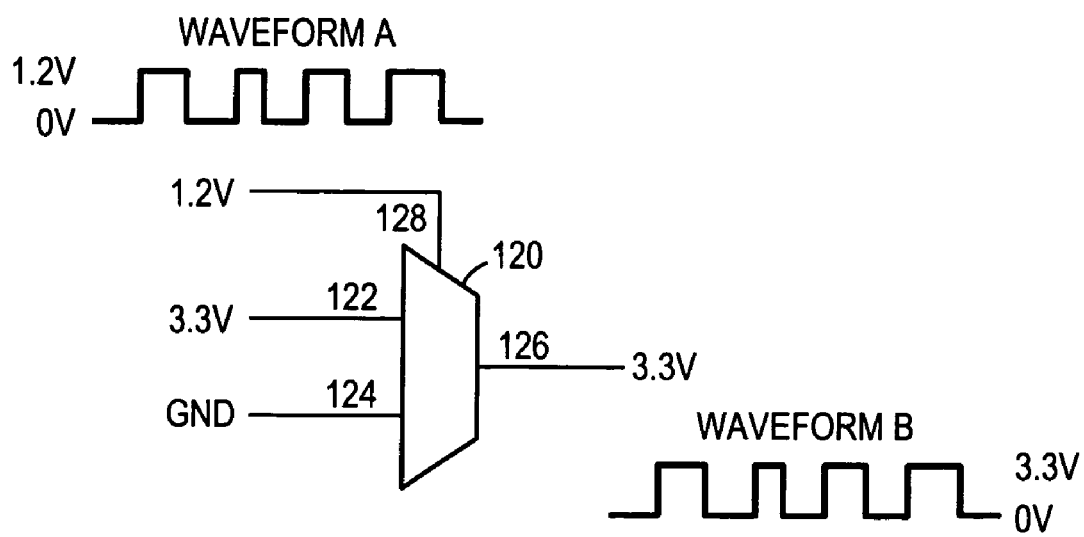
FIG. 8 is a schematic representation of an alternate implementation of the analog level shifter in accordance with the invention.

A further aspect of the invention is shown in FIGS. 7 and 8. It is known that, in the near future, microprocessors such as 54 (FIG. 5) will operate at new, lower input voltages, on the order of 1.2V. Most test logic, including the ITP and JTAG logic, operate at 5V or 3.3V. It will thus be necessary to provide a way to convert the test voltages to the lower voltage used by the new CPUs, and vice-versa. So, in accordance with the invention, a mechanism is provided for converting a signal voltage, for example 3.3V, to a lower signal voltage of 1.2V. Referring to FIG. 7, there is shown an analog switch 120. The switch may be for example a ON Semiconductor NLASB3157 2:1 multiplexer or one of the several analog switches in an IDT QS3384 10 bit bus switch. Such a switch provides two inputs 122 and 124, and output 126, and a select input 128. The select input 128 causes one of the two inputs 122 or 124 to be passed to the output 126, depending on the level of the select input 128. When the select input 128 is asserted, the voltage level on the input 122 is passed to the output 126. When the select input is deasserted, the voltage level on the input 124 is passed to the output 126. In accordance with the invention as shown in FIG. 7, a 3.3V signal is coupled to the select input 128. The input 122 is coupled to a 1.2V level. The input 124 is coupled to ground. When the 3.3V signal is asserted, the output 126 outputs a 1.2V level. When the 3.3V signal is deasserted, the output 126 outputs a ground level. The output 126 thus switches between 0 and 1.2V in the same manner that the 3.3V signal is switching at the select input 128, as shown by waveform_A and waveform_B. The 3.3V signal is thereby converted to a 1.2 V signal.

Likewise, as shown in FIG. 8, when a 1.2 volt signal needs to be converted to a 3.3V signal, the 1.2V signal is coupled to the select input 128 and the 3.3V signal is coupled to the input 122. The 1.2V signal is thereby converted to a 3.3V signal in the same manner as previously described.

Referring back to FIGS. 5 and 6, level shifters 130, 132, 134, 136, 138, and 140 can be seen coupled into some JTAG loop signals. These level shifters include the switch 120 as described above, and are used to convert from 3.3V to 1.2V wherever needed, and back from 1.2V to 3.3V where needed. So, for example, 3.3V to 1.2V level shifters are seen coupled between the enable devices 94 and the blade 18*a* CPU loop 72, and between the enable devices 96 and the blade 18*b* CPU loop 74, as the CPUs 54 do require 1.2V. So, wherever a test signal must be interfaced to a 1.2V signal, the switch 120 is employed to convert the voltage level of the signal as shown in FIG. 7. Likewise, where a 1.2V signal must be converted back to a test signal level, the switch 120 is employed as shown in FIG. 8. It is clear, though, that the JTAG loop invention can be employed in systems using conventional voltage levels without the voltage level shifters.

All the various aspects of the invention described herein combine to provide a novel test module that significantly reduces system costs. Because all the test circuitry and test connectors are located on the test module, which is removed when testing is complete, the cost of all these components is eliminated from the shipping system. Furthermore, the test module enables the flexible combination of JTAG loop testing that could not be feasibly implemented on the system modules themselves.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the invention. For example, though specific test functions such as CPU emulation and JTAG testing have been described, the test module can support many other types of module testing, both proprietary and standard. Further, although aspects of the present invention have been described herein in the context of a particular implementation in a particular environment for a particular purpose, those of ordinary skill in the art will recognize that its usefulness is not limited thereto and that the present invention can be beneficially implemented in any number of environments for any number of purposes.

We claim:

1. A system comprising:
    one or more system modules installed in a chassis, at least one system module being testable by test circuitry and one or more test devices;
    a test module for installing in the chassis and coupling to the one or more system modules, the test module comprising:
    said test circuitry;
    a plurality of test connectors constructed and arranged to physically connect and disconnect the test module to the one or more test devices; and
    wherein the test module is physically removable from the chassis upon completion of testing by the one or more test devices.

2. The system of claim 1 wherein one or more of the test connectors are manufacturing test connectors for performing voltage margining of the system modules.

3. The system of claim 1 wherein one or more of the test connectors are ITP connectors for performing CPU emulation.

4. The system of claim 1 wherein one or more of the test connectors are IEEE Std 1149.1-1990 compatible connectors for performing IEEE Std 1149.1-1990 compatible boundary scanning.

5. The system of claim 4 wherein one of the test connectors is a IEEE Std 1149.1-1990 compatible selection connector for selecting one or more of a plurality of IEEE Std 1149.1-1990 compatible loops on the one or more system modules for testing.

6. The system of claim 1 wherein one or more of the test connectors are manufacturing test connectors for performing voltage margining of the system modules; one or more of the test connectors are ITP connectors for performing CPU emulation; one or more of the test connectors are IEEE Std 1149.1-1990 compatible connectors for performing IEEE Std 1149.1-1990 compatible boundary scanning.

7. The system of claim 6 wherein one of the test connectors is a IEEE Std 1149.1-1990 compatible selection connector for selecting one or more of a plurality of IEEE Std 1149.1-1990 compatible loops on the one or more system modules for testing.

8. A test module for testing system modules in a system, the test module comprising:
    module connectors constructed and arranged to physically connect and disconnect the test module to one or more system modules, and constructed and arranged to physically remove the test module from the system module such that the system module is no longer connected to the test module once testing is complete;
    test connectors for coupling to one or more test devices;
    test circuitry;
    wherein the at least one system module is tested by the test circuitry and one or more test devices and wherein during testing of the system modules, test signals flow from the one or more test devices through the test connectors, through the test circuitry, and through the module connectors to the system modules and thereafter the test module is physically removed from the system module without damage to either the test module or system module.

9. The system of claim 8 wherein one or more of the test connectors are manufacturing test connectors for performing voltage margining of the system modules.

10. The system of claim 8 wherein one or more of the test connectors are ITP connectors for performing CPU emulation.

11. The system of claim 8 wherein one or more of the test connectors are IEEE Std 1149.1-1990 compatible connectors for performing IEEE Std 1149.1-1990 compatible boundary scanning.

12. The system of claim 11 wherein one of the test connectors is a IEEE Std 1149.1-1990 compatible selection connector for selecting one or more of a plurality of IEEE Std 1149.1-1990 compatible loops on the one or more system modules for testing.

13. The system of claim 8 wherein one or more of the test connectors are manufacturing test connectors for performing voltage margining of the system modules; one or more of the test connectors are ITP connectors for performing CPU emulation; and one or more of the test connectors are IEEE Std 1149.1-1990 compatible connectors for performing IEEE Std 1149.1-1990 compatible boundary scanning.

14. The system of claim 13 wherein one of the test connectors is a IEEE Std 1149.1-1990 compatible selection connector for selecting one or more of a plurality of IEEE Std 1149.1-1990 compatible loops on the one or more system modules for testing.

15. A method comprising the steps of:
    physically coupling a test module to one or more system modules, at least one system module being testable by test circuitry and one or more test devices; the test module comprising:
    said test circuitry;
    a plurality of test connectors;
    physically coupling the test module to one or more of the test devices via the test connectors;
    testing the system modules;
    physically removing the test module from the system modules upon completion of testing.

16. The method of claim 15 wherein one or more of the test connectors are manufacturing test connectors and the step of testing comprises performing voltage margining of the system modules.

17. The method of claim 15 wherein one or more of the test connectors are ITP connectors and the step of testing comprises performing CPU emulation.

18. The method of claim 15 wherein one or more of the test connectors are IEEE Std 1149.1-1990 compatible connectors and the step of testing comprises performing IEEE Std 1149.1-1990 compatible boundary scanning.

19. The method of claim 18 wherein one of the test connectors is a IEEE Std 1149.1-1990 compatible selection connector for selecting one or more of a plurality of IEEE Std 1149.1-1990 compatible loops on the one or more system modules for testing.

20. The method of claim 15 wherein one or more of the test connectors are manufacturing test connectors for performing voltage margining of the system modules; one or more of the test connectors are ITP connectors for performing CPU emulation; one or more of the test connectors are IEEE Std 1149.1-1990 compatible connectors for performing IEEE Std 1149.1-1990 compatible boundary scanning and boundary scanning; and the step of the testing comprises performing one of: voltage margining, CPU emulation, and boundary scanning.

21. The method of claim 20 wherein one of the test connectors is a IEEE Std 1149.1-1990 compatible selection connector for selecting one or more of a plurality of IEEE Std 1149.1-1990 compatible loops on the one or more system modules for testing.

* * * * *